United States Patent
Kalsekar

(10) Patent No.: US 11,626,303 B2
(45) Date of Patent: Apr. 11, 2023

(54) COMPLIANCE COMPONENTS FOR SEMICONDUCTOR PROCESSING SYSTEM

(71) Applicant: Applied Materials, Inc., Santa Clara, CA (US)

(72) Inventor: Viren Kalsekar, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 278 days.

(21) Appl. No.: 16/856,262

(22) Filed: Apr. 23, 2020

(65) Prior Publication Data

US 2021/0335635 A1 Oct. 28, 2021

(51) Int. Cl.
*H01L 21/67* (2006.01)
*H01L 21/677* (2006.01)

(52) U.S. Cl.
CPC .. *H01L 21/67207* (2013.01); *H01L 21/67023* (2013.01); *H01L 21/67196* (2013.01); *H01L 21/67772* (2013.01)

(58) Field of Classification Search
CPC ......... H01L 21/67207; H01L 21/67023; H01L 21/67196; H01L 21/67772; H01L 21/67017; H01L 21/67126; H01L 21/68771; H01L 21/6719; H01J 37/32779
USPC .......................................................... 118/50
See application file for complete search history.

(56) References Cited

U.S. PATENT DOCUMENTS

| 5,667,592 | A | | 9/1997 | Boitnott et al. |
| 5,911,834 | A | * | 6/1999 | Fairbairn ................... B01J 4/00 |
| | | | | 134/1.2 |
| 2010/0294199 | A1 | | 11/2010 | Tran et al. |
| 2011/0139372 | A1 | | 6/2011 | Blonigan et al. |

FOREIGN PATENT DOCUMENTS

| JP | 2019-004141 A | 1/2019 |
| KR | 2019-0000370 A | 1/2019 |

OTHER PUBLICATIONS

International Search Report and Written Opinion dated Aug. 2, 2021 in International Patent Application No. PCT/US2021/027976, 10 pages.

* cited by examiner

*Primary Examiner* — Vu A Vu
(74) *Attorney, Agent, or Firm* — Kilpatrick Townsend & Stockton LLP

(57) ABSTRACT

Exemplary substrate processing systems may include a chamber body defining a transfer region. The systems may include a first lid plate seated on the chamber body along a first surface of the first lid plate. The first lid plate may define a plurality of apertures through the first lid plate. The systems may include a plurality of lid stacks equal to a number of apertures of the plurality of apertures. The plurality of lid stacks may at least partially define a plurality of processing regions vertically offset from the transfer region. The systems may include a second lid plate coupled with the plurality of lid stacks. The plurality of lid stacks may be positioned between the first lid plate and the second lid plate. A component of each lid stack of the plurality of lid stacks may be coupled with the second lid plate.

19 Claims, 6 Drawing Sheets

COMPLIANCE COMPONENTS FOR SEMICONDUCTOR PROCESSING SYSTEM

TECHNICAL FIELD

The present technology relates to semiconductor processing equipment. More specifically, the present technology relates to semiconductor chamber components to improve vacuum compliance.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Some processing systems may include multiple processing regions and transfer regions connected together. The processing regions may have individual stack components, which may all have been machined prior to producing the system. Machine tolerances can impact the coupling of components when a vacuum is drawn on the system, and in some scenarios may cause leaks.

Thus, there is a need for improved systems and components that can be used to produce sealed regions within semiconductor processing chambers and systems. These and other needs are addressed by the present technology.

SUMMARY

Exemplary substrate processing systems may include a chamber body defining a transfer region. The systems may include a first lid plate seated on the chamber body along a first surface of the first lid plate. The first lid plate may define a plurality of apertures through the first lid plate. The systems may include a plurality of lid stacks equal to a number of apertures of the plurality of apertures. The plurality of lid stacks may at least partially define a plurality of processing regions vertically offset from the transfer region. The systems may include a second lid plate coupled with the plurality of lid stacks. The plurality of lid stacks may be positioned between the first lid plate and the second lid plate. A component of each lid stack of the plurality of lid stacks may be coupled with the second lid plate.

In some embodiments, the systems may include a plurality of substrate supports disposed about the transfer region. Each substrate support of the plurality of substrate supports may be vertically translatable along a central axis of the substrate support between a first position and a second position. The first lid plate may further define a recessed ledge about each aperture of the plurality of apertures in a second surface of the first lid plate opposite the first surface of the first lid plate. Each lid stack of the plurality of lid stacks may be seated on the first lid plate on a separate recessed ledge defined in the second surface of the first lid plate. The transfer region may include a transfer apparatus rotatable about a central axis and configured to engage substrates and transfer substrates among a plurality of substrate supports within the transfer region. The second lid plate may define a plurality of apertures through the second lid plate. Each aperture of the plurality of apertures may access a lid stack of the plurality of lid stacks. The substrate processing systems may also include a plurality of output manifolds, each output manifold of the plurality of output manifolds disposed in a separate aperture of the plurality of apertures defined through the second lid plate.

The component of each lid stack of the plurality of lid stacks coupled with the second lid plate may be characterized by a first surface facing the second lid plate, and characterized by a second surface opposite the first surface. The systems may include a first o-ring positioned on the first surface of the component of each lid stack of the plurality of lid stacks coupled with the second lid plate. Each first o-ring may engage a corresponding output manifold. The component of each lid stack of the plurality of lid stacks may be coupled with the second lid plate at a plurality of locations with a plurality of engagement apparatuses. Each engagement apparatus may include a bolt extending through the component of each lid stack and engaging the second lid plate. The apparatus may include a washer seated against the bolt, and a spring engaging the washer at a first end of the spring and the component of each lid stack at a second end of the spring opposite the first. Each engagement apparatus may include a clip extending about the bolt. The clip may be sized to seat the washer along a first surface of the washer when the bolt is disengaged from the second lid plate. A gap may be maintained between the clip and the washer when the bolt engages the second lid plate. The clip of each engagement apparatus may be a first clip, and each engagement apparatus may also include a second clip extending about the bolt. Each second clip may be sized to seat on the washer along a second surface of the washer when the bolt is disengaged from the second lid plate.

Some embodiments of the present technology may encompass substrate processing systems. The systems may include a chamber body defining a transfer region. The systems may include a first lid plate seated on the chamber body along a first surface of the first lid plate. The first lid plate may define a plurality of apertures through the first lid plate. The systems may include a plurality of lid stacks equal to a number of apertures of the plurality of apertures. The plurality of lid stacks may at least partially define a plurality of processing regions vertically offset from the transfer region. Each lid stack of the plurality of lid stacks may include a gasbox. The systems may include a second lid plate coupled with the plurality of lid stacks. The plurality of lid stacks may be positioned between the first lid plate and the second lid plate. The gasbox of each lid stack of the plurality of lid stacks may be coupled with the second lid plate by a plurality of engagement apparatuses. Each engagement apparatus may include a spring compressibly engaging the gasbox with the second lid plate.

In some embodiments, each engagement apparatus may include a shoulder bolt extending through the gasbox and engaging the second lid plate. A shank of the shoulder bolt may seat against the second lid plate when the shoulder bolt is fully engaged with the second lid plate. Each engagement apparatus may include a washer seated against the shoulder bolt at a head of the shoulder bolt about the shank. Each engagement apparatus may include a spring engaging the washer at a first end of the spring and engaging the gasbox at a second end of the spring opposite the first end of the spring. Each engagement apparatus may include a clip disposed within the gasbox about the shoulder bolt. The clip may be sized to seat the washer along a first surface of the washer when the shoulder bolt is disengaged from the second lid plate. A gap may be maintained between the clip and the washer when the shank of the shoulder bolt is seated against the second lid plate. The systems may include a transfer apparatus positioned within the transfer region and rotatable about a central axis. The transfer apparatus may be configured to engage substrates and transfer substrates among a plurality of substrate supports within the transfer region. The second lid plate may define a plurality of apertures through the second lid plate. Each aperture of the plurality of apertures may access a lid stack of the plurality of lid stacks. The substrate processing systems may include a plurality of output manifolds, each output manifold of the plurality of output manifolds disposed in a separate aperture of the plurality of apertures defined through the second lid plate. The systems may include a remote plasma unit seated on the second lid plate and fluidly coupled with each output manifold of the plurality of output manifolds.

Some embodiments of the present technology may encompass gasbox assemblies. The assemblies may include a gasbox characterized by a first surface and a second surface opposite the first surface. A recess may be defined within the gasbox from the second surface, and an aperture may be defined through the first surface accessing the recess. The assemblies may include a first clip seated in the gasbox within the recess. The assemblies may include a bolt positioned within the recess and extending through the aperture defined in the first surface of the gasbox. The assemblies may include a washer extending about the bolt and positioned between the first clip and the first surface of the gasbox. The assemblies may include a second clip extending about the bolt and positioned between the washer and the first surface of the gasbox. The assemblies may include a spring positioned in the recess and engaging the washer at a first end of the spring and engaging the gasbox at a second end of the spring opposite the first end of the spring.

Such technology may provide numerous benefits over conventional systems and techniques. For example, the engagement apparatuses may facilitate production of sufficient compression against sealing gaskets used within the system. Additionally, the engagement apparatuses may balance gap formation on multiple sides of chamber components to ensure adequate sealing during processing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
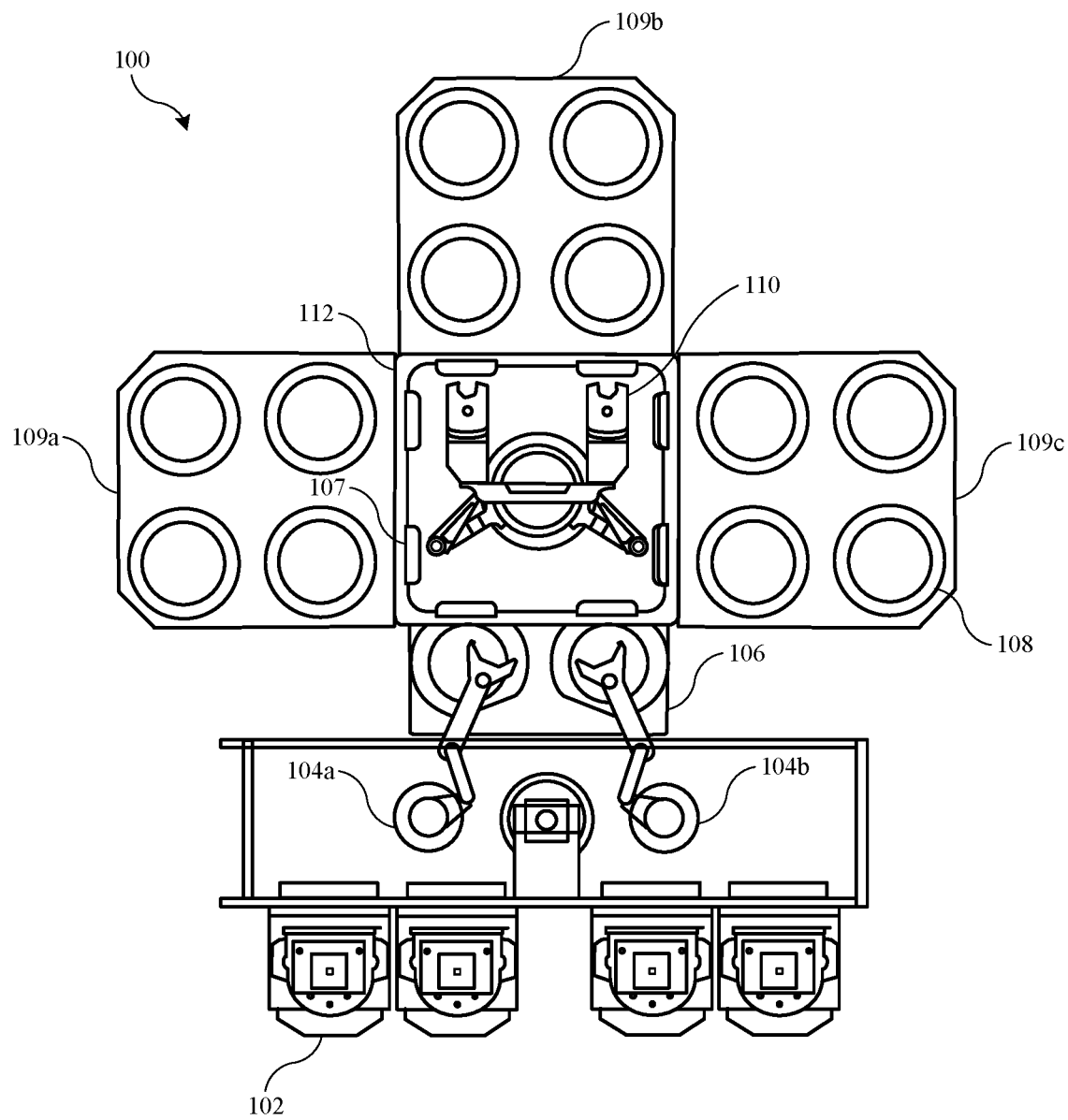
FIG. 1A shows a schematic top view of an exemplary processing tool according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

As additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. A substrate support may then vertically translate between the transfer region and the processing region to deliver a substrate for processing.

Each individual processing location may include a separate lid stack to provide improved and more uniform delivery of processing precursors into the separate processing regions. Although each lid stack may include substantially identical components, machining and production tolerances may cause differences in component flatness, thickness, or other component characteristics. While some of these tolerance non-uniformities may be accommodated by gaskets or o-rings positioned between each lid stack component, certain scenarios may produce one or more lid stacks of the set that have a height differential from the others, which cannot be accommodated by the o-rings. The present technology overcomes these issues by incorporating one or more engagement apparatuses that control a gap distance between components of the system, while ensuring compliance with characteristics of o-rings and component structures.

Although the remaining disclosure will routinely identify specific structures, such as four-position transfer regions, for which the present structures and methods may be employed, it will be readily understood that the engagement apparatuses or components may be equally employed in any number of other systems or chambers, as well as any other apparatus in which multiple components may be joined or coupled. Accordingly, the technology should not be considered to be so limited as for use with any particular chambers alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
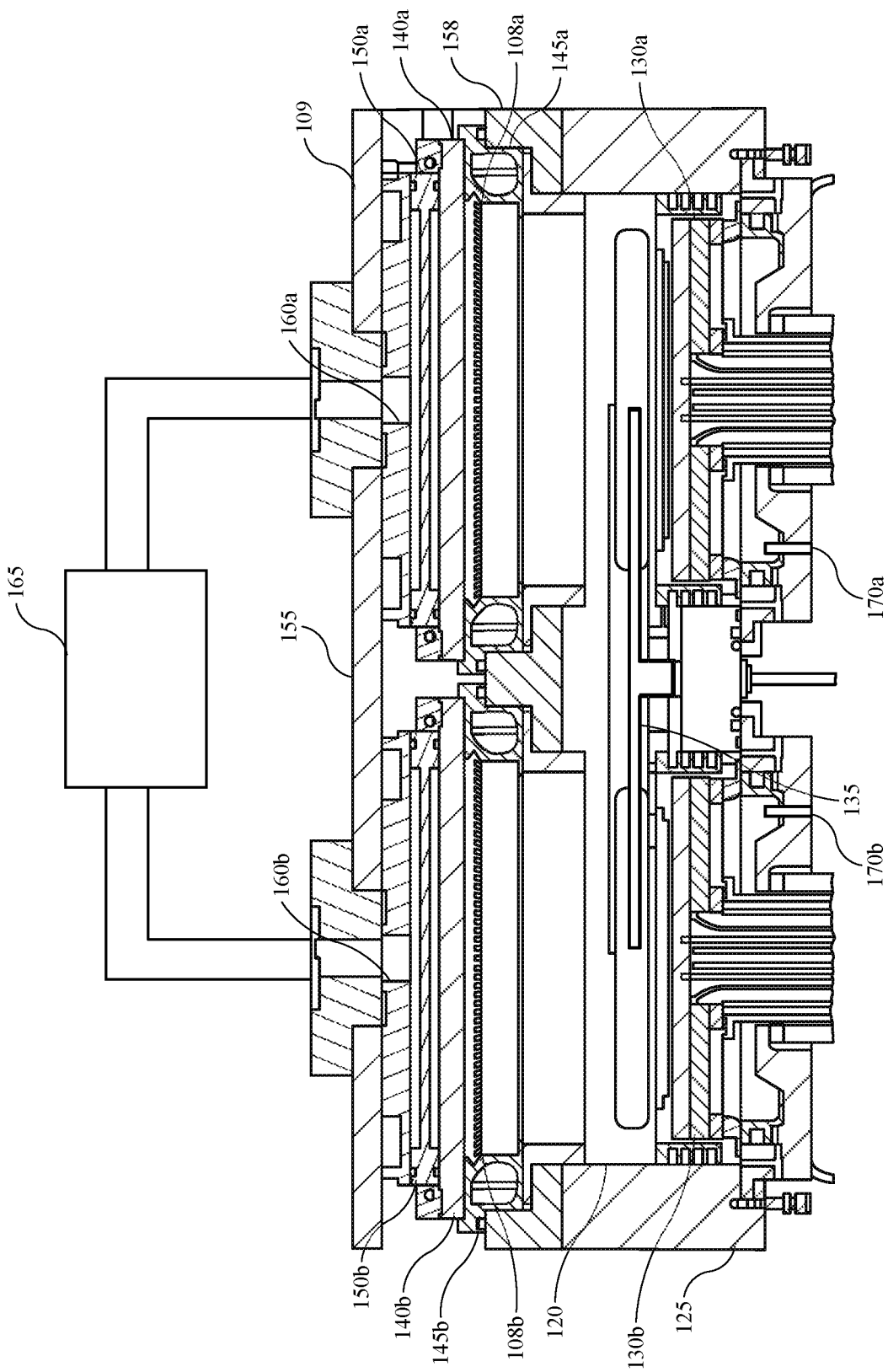
FIG. 1B shows a schematic partial cross-sectional view of an exemplary processing system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130*a* may deliver a substrate into processing region 108*a*, while substrate support 130*b* may deliver a substrate into processing region 108*b*. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140*a* may be included to define from above processing region 108*a*, and faceplate 140*b* may be included to define from above processing region 108*b*. In some embodiments the substrate support may operate as the companion electrode for generating a capacitively-coupled plasma between the faceplate and the substrate support. A pumping liner 145 may at least partially define the processing region 108 radially, or laterally depending on the volume geometry. Again, separate pumping liners may be utilized for each processing region. For example, pumping liner 145*a* may at least partially radially define processing region 108*a*, and pumping liner 145*b* may at least partially radially define processing region 108*b*. A blocker plate 150 may be positioned between a lid 155 and the faceplate 140 in embodiments, and again separate blocker plates may be included to facilitate fluid distribution within each processing region. For example, blocker plate 150*a* may be included for distribution towards processing region 108*a*, and blocker plate 150*b* may be included for distribution towards processing region 108*b*.

Lid 155 may be a separate component for each processing region, or may include one or more common aspects. Lid 155 may be one of two separate lid plates of the system in some embodiments. For example, a first lid plate 158 may be seated over transfer region housing 125. The transfer region housing may define an open volume, and first lid plate 158 may include a number of apertures through the lid plate separating the overlying volume into specific processing regions. In some embodiments, such as illustrated, lid 155 may be a second lid plate, and may be a single component defining multiple apertures 160 for fluid delivery to individual processing regions. For example, lid 155 may define a first aperture 160*a* for fluid delivery to processing region 108*a*, and lid 155 may define a second aperture 160*b* for fluid delivery to processing region 108*b*. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

In some embodiments a purge channel 170 may extend through the transfer region housing proximate or near each substrate support 130. For example, a plurality of purge channels may extend through the transfer region housing to provide fluid access for a fluidly coupled purge gas to be delivered into the transfer region. The number of purge channels may be the same or different, including more or less, than the number of substrate supports within the processing system. For example, a purge channel 170 may extend through the transfer region housing beneath each substrate support. With the two substrate supports 130 illustrated, a first purge channel 170*a* may extend through the housing proximate substrate support 130*a*, and a second purge channel 170*b* may extend through the housing proximate substrate support 130*b*. It is to be understood that any additional substrate supports may similarly have a plumbed purge channel extending through the transfer region housing to provide a purge gas into the transfer region.

When purge gas is delivered through one or more of the purge channels, it may be similarly exhausted through pumping liners 145, which may provide all exhaust paths from the processing system. Consequently, in some embodiments both the processing precursors and the purge gases may be exhausted through the pumping liners. The purge gases may flow upwards to an associated pumping liner, for example purge gas flowed through purge channel 170b may be exhausted from the processing system from pumping liner 145b.

Figure 2:
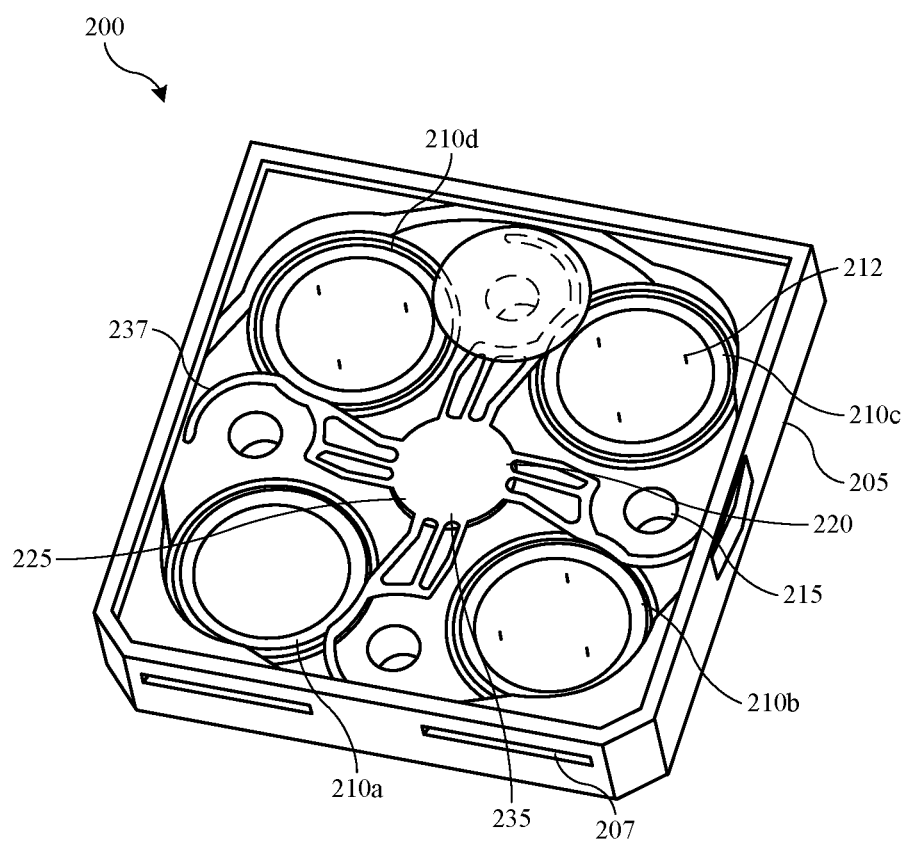
FIG. 2 shows a schematic isometric view of a transfer section of an exemplary substrate processing system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology.

Figure 3:
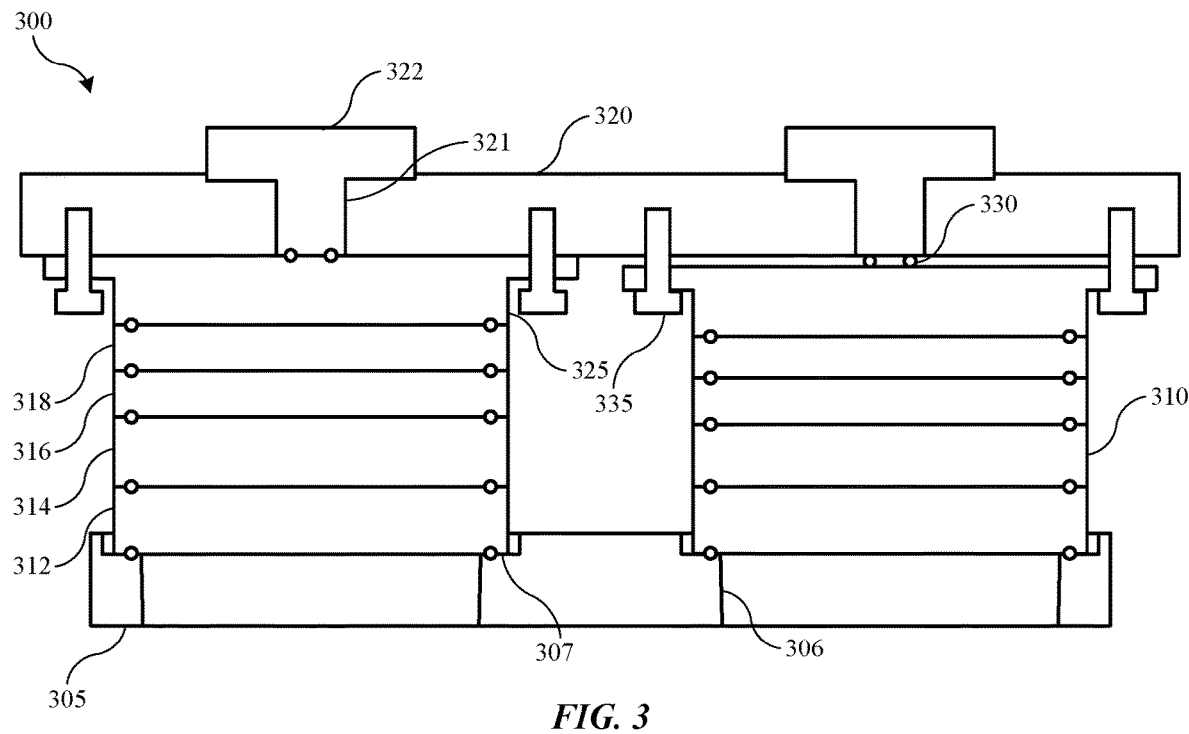
FIG. 3 shows a schematic cross-sectional view of an exemplary system arrangement of an exemplary substrate processing system according to some embodiments of the present technology.

FIG. 3 shows a schematic partial cross-sectional view of an exemplary processing system 300 arrangement of an exemplary substrate processing system according to some embodiments of the present technology. The figure may illustrate aspects of the processing systems and components described above, and may illustrate additional aspects of the system. The figure may illustrate a simplified version of the system with a number of components removed to facilitate illustration of coupling of the lid stack components. It is to be understood that processing system 300 may include any aspect of any portion of the processing systems described or illustrated elsewhere, and may illustrate aspects of a lid stack incorporated with any of the systems described elsewhere. For example, processing system 300 may illustrate a portion of a system overlying the transfer region of a chamber, and may show components positioned over a chamber body defining a transfer region as previously described. It is to be understood that the any previously noted components may still be incorporated, such as including a transfer region and any component described previously for a system including the components of processing system 300.

As noted previously, multi-chamber systems may include individual lid stacks for each processing region. Processing system 300 may illustrate a view of two lid stacks that may be part of a multi-chamber system including two, three, four, five, six, or more processing chamber sections. As described above, one or more lid plates may contain the individual lid stacks for each processing region. For example, as illustrated, processing system 300 may include a first lid plate 305, which may be or include any aspect of lid plate 158 described above. For example, first lid plate 305 may be a single lid plate that may be seated on the transfer region housing, or chamber body as previously described. The first lid plate 305 may be seated on the housing along a first surface of the lid plate. Lid plate 305 may define a plurality of apertures 306 through the lid plate allowing the vertical translation of substrates into the defined processing regions as previously described.

Seated on the first lid plate 305 may be a plurality of lid stacks 310 as previously described. In some embodiments, the first lid plate 305 may define a recessed ledge 307 extending from a second surface of the first lid plate 305 opposite the first surface. The recessed ledge 307 may extend about each aperture 306 of the plurality of apertures. Each individual lid stack 310 may be seated on a separate recessed ledge 307 as illustrated. The plurality of lid stacks 310 may include a number of lid stacks equal to a number of apertures of the plurality of apertures defined through the first lid plate. The lid stacks may at least partially define a plurality of processing regions vertically offset from the transfer region as described above. Although two apertures 306 and two lid stacks 310 are illustrated, it is to be understood that the processing system 300 may include any number of lid stacks in embodiments encompassed by the present technology.

The lid stacks may include any number of components in embodiments, and may include any of the components described above. For example, the lid stack components may include a liner plate 312, a pumping liner 314, a faceplate 316, and a blocker plate 318. Faceplate 316 and blocker plate 318 may define a number of apertures for distributing process precursors into a processing region defined from above by faceplate 316, and radially defined at least partially by pumping liner 314. A substrate support translated up towards the faceplate through the corresponding aperture 306 in first lid plate 305 may at least partially define the processing region from below.

Extending over the lid stacks 310 may be a second lid plate 320. Second lid plate 320 may extend fully over each lid stack of the processing system, and may provide access to the individual processing regions via a plurality of apertures 321 defined through the second lid plate 320. Each aperture 321 may provide fluid access to the individual lid stacks, and the apertures 321 may be axially aligned with a corresponding lid stack and/or substrate support as illustrated previously. Disposed within the apertures through second lid plate 320 may be output manifolds 322. An output manifold may be at least partially positioned in an aperture through the second lid plate 320, and may at least partially seat on the second lid plate as illustrated. The output manifolds may be fluidly coupled with one or more precursor delivery sources, and may provide fluid access from a remote plasma source as previously described. Individual remote plasma sources may be coupled with each output manifold, or one or more remote plasma sources may be coupled with multiple output manifolds as previously described.

The lid stack components 310 may be seated together and may or may not be mechanically coupled together. Elastomeric elements, such as gaskets or o-rings, for example, may be positioned between each plate as illustrated. The elastomeric elements may be seated in grooves or channels formed along adjacent surfaces of the plates. In some embodiments as illustrated, the elastomeric elements may be vertically aligned to limit or prevent any cantilever effect of the placements when vacuum is pulled on the chambers. To facilitate sealing of the second lid plate 320 with the lid stacks, in some embodiments at least one component of each lid stack of the plurality of lid stacks may be coupled with the second lid plate 320.

As illustrated in the figure, at least one lid stack component, which may be a gasbox 325 in some embodiments, may be coupled with a backside of the second lid plate 320 as illustrated. While the output manifolds may be seated on a first surface of the upper lid, along with a remote plasma source in some embodiments, the gasbox may be coupled with a second surface of the second lid plate opposite the first surface. In some embodiments a flange may extend from a first surface of gasbox 325 where the gas box may be seated against the second lid plate. In some embodiments, as will be further described below, recessed pockets may extend from a second surface of the gasbox 325, where the second surface of the gasbox may be seated on blocker plate 318 as illustrated. Any number of lid stack components may be coupled with the second lid plate 320, while any number of other lid stack components may be seated on or coupled with first lid plate 305. In some embodiments, only a single plate, which may be the uppermost plate of the lid stack, and which may be a gasbox 325, may be coupled with the second lid plate 320.

As explained previously, each lid stack 310 may include the same components, which may all have been manufactured in a similar fashion. However, machine tolerances may cause discrepancies between the components, and may affect flatness of any component, including the second lid plate. Additionally, tolerances may impact component thicknesses. Although any discrepancies are likely to be relatively equally distributed among the components of the various lid stacks, in some scenarios compounded effects can cause one lid stack to be offset from one or more other lid stacks.

Because second lid plate 320 may be relatively planar with respect to each of the plurality of lid stacks, the offset may cause a gap to form within one lid stack.

FIG. 3 illustrates a scenario where tolerance differences may be concentrated within one lid stack 310, which may cause a gap to form between the gasbox 325 and the second lid plate 320. Although the gap may be relatively small, such as less than 1 mm, or less than or about 0.5 mm, this may be sufficient to cause leakage within the system. For example, elastomeric element or o-ring 330 may be seated or positioned between the gasbox 325 and the second lid plate 320. As illustrated, the o-ring is positioned between the output manifold 322 and the gasbox, which may form a vacuum seal through the fluid path between the components. To ensure a sufficient seal, the o-ring may be seated to a particular compression based on the cross-sectional diameter of the component. For example, o-ring 330 may be characterized by a cross-sectional diameter of less than or about 10 mm, less than or about 7 mm, less than or about 5 mm, or less. The gap caused by tolerance issues may be characterized by a distance of less than or about 1 mm, and may be less than or about 0.7 mm, less than or about 0.6 mm, less than or about 0.5 mm, or less.

Accommodating this gap may occur in multiple ways where lid stack 310 has components seated on first lid plate 305, and one or more components coupled with second lid plate 320. For example, if second lid plate 320 is completely seated against second lid plate 320, a greater compression may be exerted on o-ring 330, which may limit or prevent any leakage between the components. However, a gap may then be formed between gasbox 325 and blocker plate 318, which may cause system leakage when vacuum is pulled on the system. Accordingly, gasbox 325 or any component coupled with second lid plate 320 may be less tightly coupled with the second lid plate. Because consistency of component coupling may impact system performance, step bolts, such as shoulder bolts, or bolts accommodating a sleeve or bushing, may be included to secure gasbox 325 with second lid plate 320 to ensure a more distributed gap between the second lid plate and gasbox, and the blocker plate and gasbox. However, because of the elastomeric element between the gasbox and second lid plate, by compensating the gap with a shoulder bolt, sufficient compression may not occur with the o-ring 330 when vacuum is pulled on the system producing force on the gasbox away from the second lid plate. For example, on a 7 mm o-ring, to ensure deflection to produce an adequate seal, and depending on materials and other characteristics of the o-ring, greater than or about 10%, greater than or about 12%, greater than or about 15%, or more, compression may be needed. When vacuum is pulled and gasbox 325 may be drawn away from the second lid plate, the weight of components on the lid plate and the vacuum force may not maintain sufficient compression of the o-ring.

When vacuum is pulled on the system, the vacuum may act on the shoulder bolts 335 in an opposite direction from the coupling with the second lid plate, which may then reduce an accommodating force against the gasbox, and which may cause more of the gap to distribute between the gasbox 325 and second lid plate 320. For example, the other lid stack components may be pulled down toward the first lid plate, which may further compress the o-rings between these components, and ensure an adequate seal. Because the gasbox 325 or other components may be bolted against the second lid plate in a direction opposite to the pull of vacuum on the system, when vacuum is pulled in the opposite direction, it may act against the force of the bolts and reduce the compression of o-ring 330. As more of the gap distributes between the gasbox and second lid plate, there may be no other countervailing force, and thus the compression of o-ring 330 may reduce even as an o-ring between the gasbox and blocker plate is more fully compressed. As more of the full gap occurs at the gasbox and second lid plate interface, compression of the o-ring may reduce below or about 15%, below or about 10%, below or about 7%, below or about 6%, below or about 5%, or less, which may cause system leakage to occur. The present technology may overcome this issue by providing an engagement apparatus to produce a countervailing force against the gasbox and o-ring, which may limit the gap at the second lid plate when vacuum is pulled.

Figure 4:
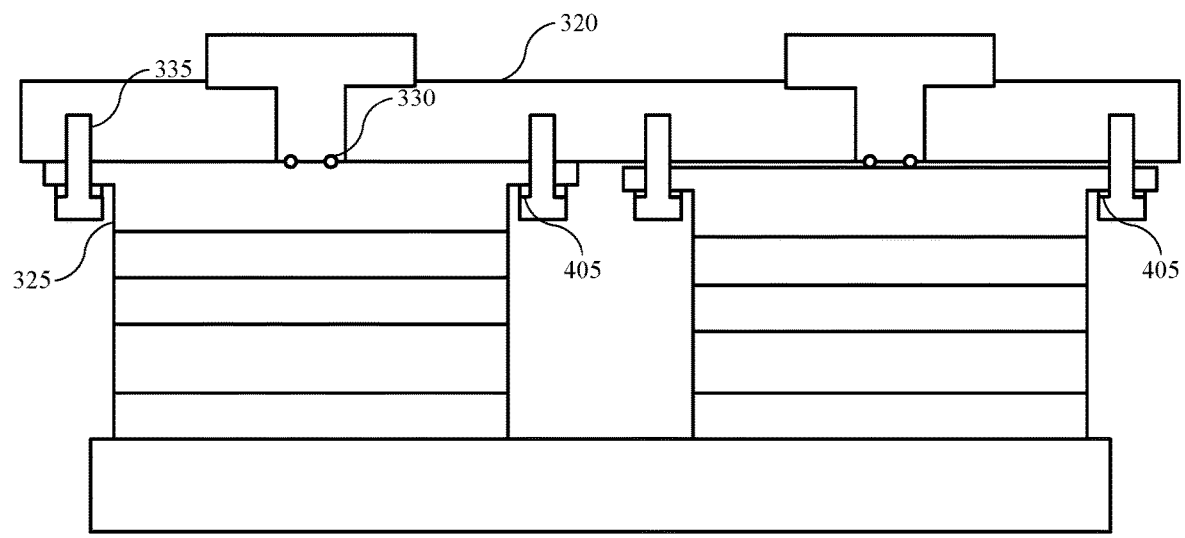
FIG. 4 shows a schematic cross-sectional view of an exemplary system arrangement of an exemplary substrate processing system according to some embodiments of the present technology.

FIG. 4 shows a schematic cross-sectional view of exemplary processing system 300 arrangement of an exemplary substrate processing system according to some embodiments of the present technology. The figure may have the same components as FIG. 3, and may include any of the features, components, or characteristics of any component or aspect of any system described previously. FIG. 4 may illustrate the incorporation of engagement apparatus 405, which may provide a countervailing force against bolt 335 and vacuum drawn upon the system to press gasbox 325 against second lid plate 320, and reduce or control any gap between the components. Exemplary engagement apparatuses will be described in further detail below, and may include a spring that operates to provide force back against the gasbox towards the second lid plate 320. Bolts 335, or any other coupling device, may create a specific position of the gasbox relative to the second lid plate 320, or may ensure a base amount of compression prior to pulling vacuum on the system, and which may ensure a certain amount of compression on o-rings 330. Once vacuum is pulled, compression on the o-rings may reduce, which may otherwise cause system leakage at o-ring 330, although additional compression may occur at the o-ring between the gasbox and blocker plate.

Embodiments of the present technology incorporating engagement apparatuses at each bolt coupling gasbox 325 with second lid plate 320, may at least partially compensate for the vacuum effect by engaging the gasbox 325 and pressing the gasbox back towards the second lid plate 320 at least a certain amount. Engagement apparatuses may include any number of components as will be described below, and may include bolts 335 in some embodiments, although the engagement apparatus may include at least one spring component, or compressible element that may produce a counterforce when compressed. Consequently, when vacuum is drawn on the system and produces a force on each component of the lid stacks towards the pumping liner or lower lid plate, the engagement apparatus may provide a counterforce on the gasbox or component or components of the lid stack coupled with the second lid plate. This may reduce or limit the effect of vacuum on lowering the compression of o-rings 330.

Figure 5:
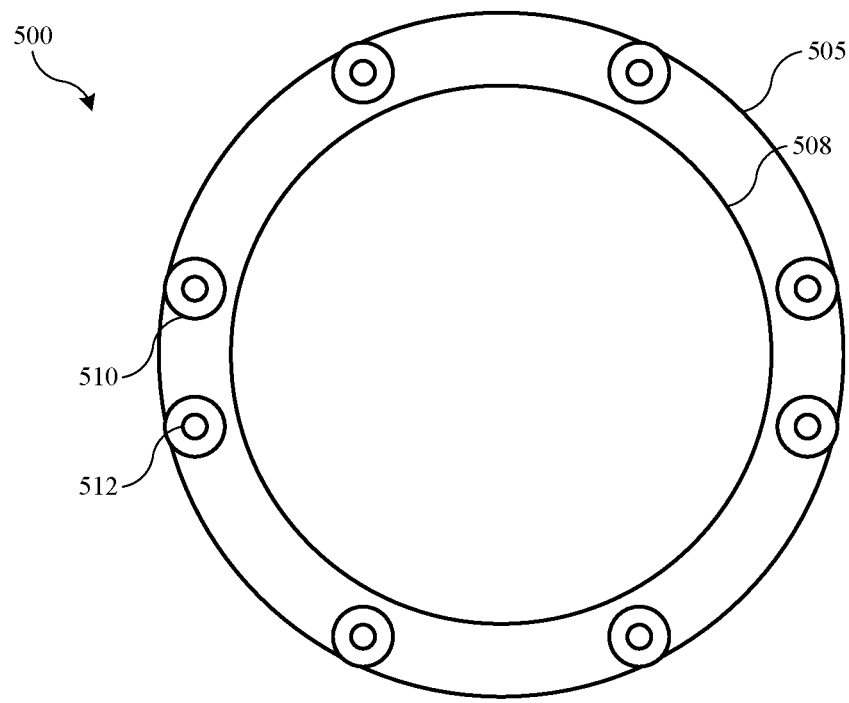
FIG. 5 shows a schematic bottom view of a lid stack component of an exemplary substrate processing system according to some embodiments of the present technology.

FIG. 4 illustrates an embodiment including a flange or lip extending about the gasbox and allowing a coupling surface for bolts extending up through the gasbox to couple the component with the second lid plate according to some embodiments of the technology. Additional embodiments may include one or more recesses or gaps formed within the gasbox, and within which may be disposed an engagement apparatus according to some embodiments of the present technology. FIG. 5 shows a schematic bottom view of a lid stack component 500 of an exemplary substrate processing system according to some embodiments of the present technology. Lid stack component 500 may be or include any component of a lid stack that may be coupled with second lid plates as previously described. For example, lid stack component 500 may be a gasbox, and may be any of the gasboxes as previously described, or include any feature or characteristics of gasboxes or any other lid stack component described above. The bottom view may illustrate second surface 505 of exemplary gasboxes, where a first surface opposite the second may be coupled against or with a second lid plate as previously described. The structure may show a groove or trench 508, within which may be seated an o-ring or other element, which may facilitate sealing between the component and any other lid stack plate, such as a blocker plate as previously described, or other component with which the gasbox may be joined.

Lid stack component 500 may also define one or more recesses 510, including a plurality of recesses about the component. The recesses may extend from second surface 505 towards a first surface opposite the second, but may not fully extend through a thickness of the component. An aperture 512 may extend from the recess 510 through a first surface, and may be sized or shaped to accommodate a bolt or coupling component used to join the component 500 with a second lid plate as illustrated previously. The recesses may be characterized by any shape or geometry, and in some embodiments the recesses may be substantially or fully cylindrical as illustrated. The recess may also at least partially intersect an outer radial edge of the component as illustrated, which may provide additional access from a radial edge of the gasbox as well as from below the gasbox, such as at the second surface. Consequently, component 500 may be characterized by an incomplete outer radial edge, which may exhibit breaks at each recess providing access to the recess along the outer radial edge of the component.

It is to be understood that any other geometry of components is also encompassed by embodiments of the present technology, and may include any of the features or characteristics described. Any number of recesses and corresponding engagement apparatuses may be included in embodiments of the present technology. The distribution may be equal between any two recesses, although in some embodiments the distances may be offset, although the distribution may be at least partially balanced about the component and may include multiple aspects of symmetry of distribution as illustrated. It is to be understood that the configuration illustrated is merely an example, and any number of other arrangements are similarly encompassed by the present technology.

Figure 6:
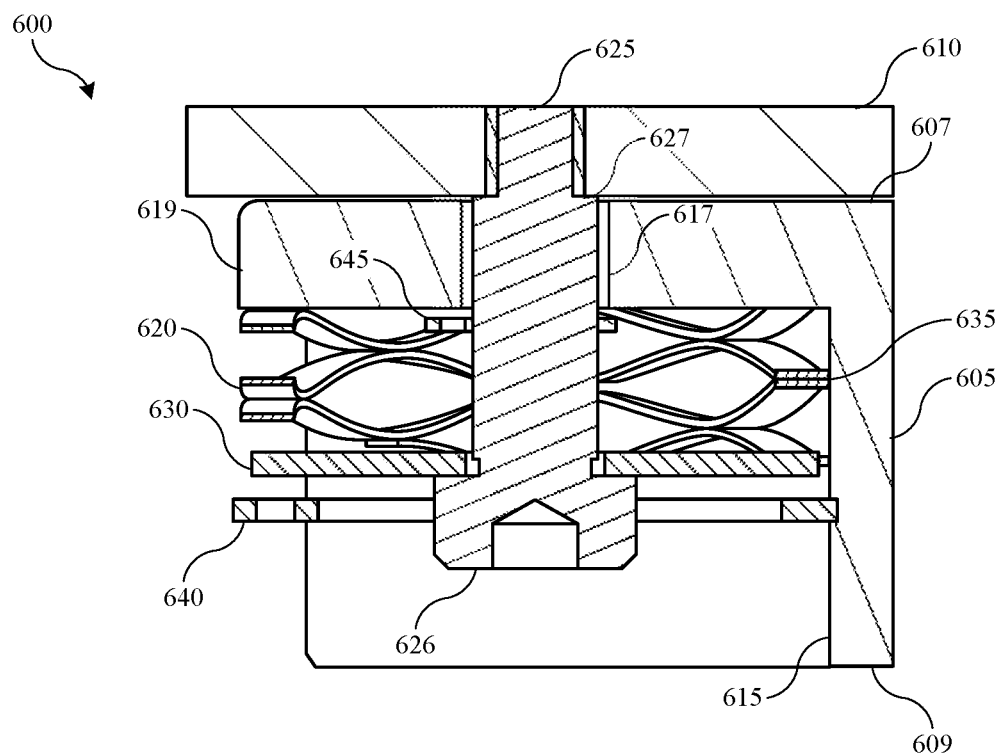
FIG. 6 shows a schematic cross-sectional partial view of a component assembly according to some embodiments of the present technology.

Turning to FIG. 6 is shown a schematic cross-sectional partial view of a component assembly 600, such as including a gasbox assembly, in some embodiments of the present technology. Component assembly 600 may be included with any system previously described, and may be a gasbox of any system discussed above. The component 605 of the assembly may be or include any component that may be engaged with another component of a system, including a second lid plate 610, which may include any aspect of a second lid plate as previously described. It is to be understood that the figure is not to be limited to any particular components, and may encompass any two components that may be coupled together with an engagement apparatus. The component 605 may be a gasbox or other lid stack component. Component 605 may include one or more recesses defined about a perimeter of the component, such as recesses 510 illustrated above. A partial cross-section through recess 615 is illustrated and may include an engagement apparatus 620. Any number of engagement apparatuses may be included with components according to embodiments of the present technology.

Component 605 may be characterized by a first surface 607, which may be adjacent second lid plate 610. The component may further be characterized by a second surface 609, which may be a surface opposite the first surface. Recess 615 may be formed from a second surface 609, and may at least partially extend through the thickness of the component towards first surface 607. In some embodiments the recess may not extend through first surface 607. An aperture 617 may be formed from first surface 607 and may provide access to recess 615. In some embodiments the aperture may be characterized by a diameter less than a diameter of the recess, and the aperture 617 may be characterized by a diameter configured to accommodate a coupler, such as a bolt, through the aperture to engage second lid plate 610. As described above, recess 615 may at least partially intersect a radial edge 619 of component 605, and may provide radial access to the recess as illustrated. Within the recess may be seated or positioned an engagement apparatus 620, aspects of which may at least partially extend outward to or beyond a radial edge 619 of component 605.

The engagement apparatus 620 according to some embodiments of the present technology may include one or more aspects configured to create a counterforce in a direction opposite a vacuum or other force imposed on component 605 as previously explained. The engagement apparatus 620 may include multiple components operably coupled to exert a force on the component 605 towards the second lid plate 610. The engagement apparatus 620 may or may not specifically include bolt 625 on which force may be exerted, although in some embodiments engagement apparatus 620 may include bolt 625. Bolt 625 may extend through recess 615 and aperture 617 to engage second lid plate 610 as illustrated. The bolt may include a head 626 characterized by a greater diameter than a shaft of the bolt, and the head 626 may reside within the recess 615 when engaged with the second lid plate 610.

Although illustrated as a bolt, it is to be understood that any of a variety of couplers may be used in embodiments of the present technology, including a screw, or other fittings or components that may join the two components. In some embodiments the bolt may be at least partially threaded along the shaft, such as at an end distal to the head 626. The bolt may also define a step 627 proximate the distal end of the bolt, which may provide a landing at which the bolt may be seated against the second lid plate 610. The step 627 may be part of a sleeve or bushing positioned about the bolt, or may be part of the bolt. For example, in some embodiments, bolt 625 may be a shoulder bolt or step bolt, which may form the shaft portion step as illustrated.

The engagement apparatus may include a disk, such as a washer 630. The washer may be an annulus in some embodiments, which may be characterized by an inner annular diameter and an outer annular diameter. The inner annular diameter may be greater than a shaft diameter of the bolt, and may be greater than the diameter of the bushing or shoulder portion of the bolt as illustrated. The outer annular diameter may less than or equal to the recess diameter. The washer may be any substantially flat disk capable of distributing force over a larger area, and may be a flat washer or fender washer, as well as any other type of washer or disk. The washer may be seated against the bolt, and may contact the head 626 of the bolt while the bolt is engaged with the second lid plate 610.

The engagement apparatus may also include a spring 635 or compressible device, which may engage the washer 630 at a first end of the spring as well as the component 605 at a second end of the spring as illustrated, and may at least partially extend about the bolt. The spring may engage the component 605 along an interior surface of the recess, which may be a surface substantially parallel with the first surface 607 of the component. The first end of the spring may be seated on washer 630. Consequently, when bolt 625 is engaged with second lid plate 610, the washer may compress the spring, which may then exert a force on the component 605 in a direction towards the second lid plate 610. When vacuum is pulled on the system, which may create a force in the opposite direction, the spring may at least partially resist this force, which may facilitate maintaining adequate compression of an o-ring as previously described. The spring may be configured to produce an amount of outward force when compressed to improve compression of the o-ring, while not overcoming a competing vacuum force, which may otherwise increase a gap between the component 605 and an underlying component, such as a blocker plate as described above.

Accordingly, in some embodiments, spring 635 may be configured to provide an outward force greater than or about 100 N, and may be configured to provide an outward force greater than or about 200 N, greater than or about 300 N, greater than or about 400 N, greater than or about 500 N, or more. In some embodiments a plurality of engagement apparatuses may be included to provide a total force that is less than a force that may overcome vacuum force and gravitational force due to the weight of the overlying components. For example, in some embodiments the total force exerted by the plurality of engagement apparatuses may be less than or about 5,000 N, and may be less than or about 4,000 N, less than or about 3,500 N, less than or about 3,000 N, less than or about 2,800 N, less than or about 2,600 N, less than or about 2,400 N, less than or about 2,200 N, less than or about 2,000 N, or less. Any type of spring or compressible structure may be used as spring 635, and which may produce an amount of force when compressed. The springs may include a leaf spring, a compression spring, a wave spring, or any other type of spring. In some embodiments a wave spring may be utilized as illustrated due to the range of expansion and force sought for the component.

By utilizing springs as described and configured, the engagement on the o-ring, such as o-ring 330 described above, may be increased to provide a compression of greater than or about 15%, and may provide compression of greater than or about 18%, greater than or about 20%, greater than or about 22%, greater than or about 24%, greater than or about 26%, greater than or about 28%, or higher, although compression may be limited to ensure sufficient compression of the component with an underlying component, such as between a gasbox and blocker plate. Consequently, the compression may be maintained below or about 30% prior to vacuum being drawn on the system. Once vacuum is drawn, which may reduce the compression of the o-ring based on the component being drawn away from the second lid plate, the counterforce applied by the spring may ensure the compression of the o-ring remains greater than or about 10%, and may ensure the compression remains greater than or about 12%, greater than or about 14%, greater than or about 16%, greater than or about 18%, greater than or about 20%, or more.

The engagement apparatus may include additional components to maintain the engagement apparatus within the recess. For example, a first clip 640 may be included within the recess to provide a stop for components of the engagement apparatus. For example, a groove or channel may be formed about the component 605 within the recess, and first clip 640, such as a c-clip, or retainer or spring clip, may be seated within the groove. The first clip 640 may be sized to extend within the recess to engage a first surface of the washer 630, opposite a second surface of the washer in contact with spring 635, when the bolt 625 is withdrawn from the second lid plate 610. The outer annular edge of washer 630 may at least partially seat on the clip to ensure the components are retained within the recess when disengaged from the second lid plate. FIG. 6 illustrates a configuration where the bolt is engaged with the second lid plate 610. When fully engaged with the lid plate, a gap may be maintained between the washer 630 and the clip 640 as illustrated. Because the clip is seated in the component 605, if the washer remained in contact with the clip during engagement, the spring would effectively exert force in both directions on the component as the component is pulled into the washer, essentially canceling any force in a direction of the second lid plate. Accordingly, a gap may be maintained between the washer and the clip when the bolt is engaged in the second lid plate as illustrated, and the gap may be greater than the distance the spring draws the component back towards the second lid plate.

The engagement apparatus may include a second clip 645 in some embodiments, which may be seated in a groove extending about the shaft or shoulder portion of bolt 625. The second clip may be sized to have an outer diameter greater than an inner annular diameter of washer 630. Accordingly, when bolt 625 is disengaged from second lid plate 610, the second clip 645 may seat on the second surface of the washer, and ensure the bolt is at least partially retained within the recess 615 for subsequent engagement. Second clip 645 may be any type of clip similar to first clip 640. Additionally, in embodiments the groove on the bolt shaft within which the clip may be seated may be spaced along the shaft to ensure that the bolt may be fully removed from the second lid plate 610 before the second clip engages the washer. The groove may also be spaced along the shaft to ensure the clip does not contact the component 605. For example, when the bolt is engaged with the second lid plate 610, the second clip may be spaced a first distance from the gasbox that may be greater than a distance adjustment when vacuum is pulled on the system.

Because bolt 625 is engaged with second lid plate 610, the bolt and corresponding second clip will not move relative to the second lid plate when vacuum is drawn on the system. However, the component 605, such as the gasbox, may be at least partially drawn away from the second lid plate as described above. Accordingly, the second clip may be spaced to ensure that the location is beyond the change in the component location after vacuum is pulled on the system. For example, in some embodiments the groove may be spaced on the bolt relative to a location of the bolt passing into aperture 617 to ensure a gap of a certain distance plus an additional amount commensurate to the tolerance gap accommodated by the component. In the example where the tolerance gap may be about 0.5 mm as discussed above, the groove may be formed along the bolt shaft to ensure the second clip is at least 1 mm from the gasbox prior to vacuum being drawn on the system, while still allowing the bolt to be fully withdrawn from the second lid plate prior to the second clip contacting the washer. Consequently, in some embodiments the groove may be a distance of twice the tolerance spacing being addressed, or may be the tolerance spacing plus some additional space amount, such as greater than or about 0.5 mm, greater than or about 1 mm, greater than or about 1.5 mm, greater than or about 2 mm, or more.

Figure 7:
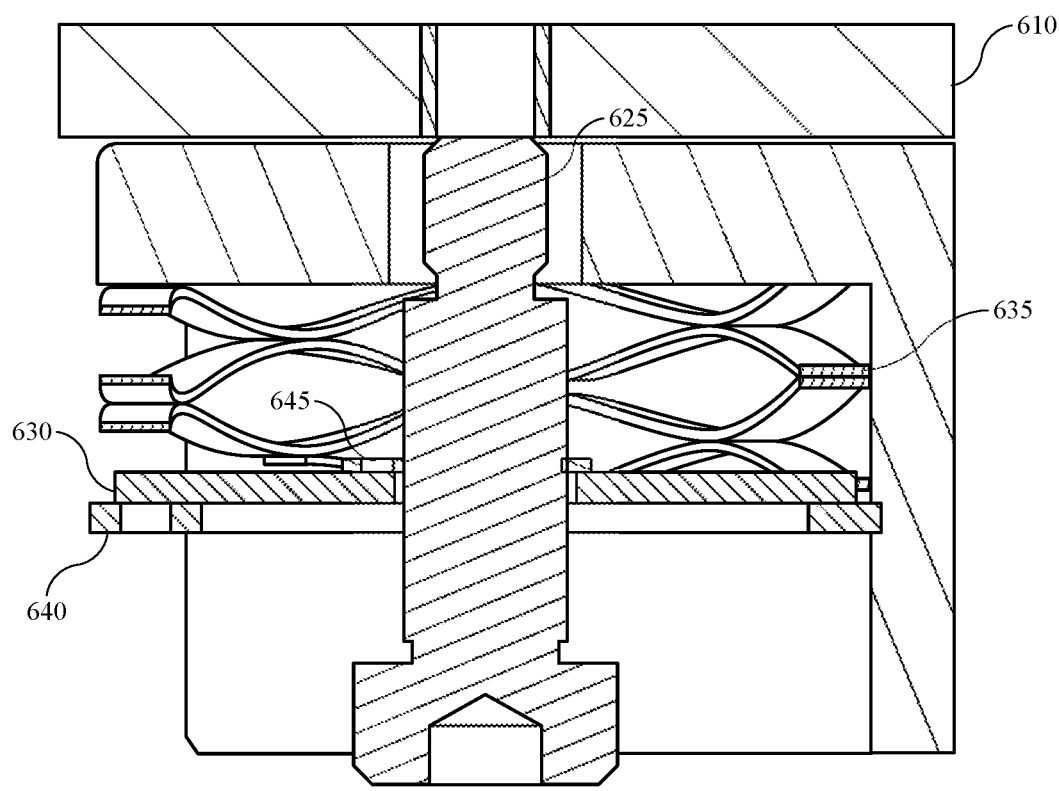
FIG. 7 shows a schematic cross-sectional partial view of a component assembly according to some embodiments of the present technology.

FIG. 7 shows a schematic cross-sectional partial view of component assembly 600, according to some embodiments of the present technology, and may illustrate the assembly when bolt 625 is removed from second lid plate 610. As shown in the illustration, bolt 625 is fully removed from second lid plate 610, which allows the bolt to fall and the spring 635 to expand. The spring may expand until washer 630 seats on first clip 640 as illustrated, and bolt 625 may fall until second clip 645 seats on washer 630. Consequently, the components remain within the recess facilitating subsequent reattachment. By utilizing engagement apparatuses according to embodiments of the present technology, tolerance gaps caused by manufacturing may be controlled to limit or prevent sealing issues during operation of the systems.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a bolt" includes a plurality of such shafts, and reference to "the aperture" includes reference to one or more connectors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate processing system comprising:
a chamber body defining a transfer region;
a first lid plate seated on the chamber body along a first surface of the first lid plate, wherein the first lid plate defines a plurality of apertures through the first lid plate;
a plurality of lid stacks equal to a number of apertures of the plurality of apertures defined through the first lid plate, wherein the plurality of lid stacks at least partially define a plurality of processing regions vertically above the transfer region; and
a second lid plate coupled with the plurality of lid stacks, wherein the plurality of lid stacks are positioned between the first lid plate and the second lid plate, and wherein a component of each lid stack of the plurality of lid stacks is coupled with the second lid plate.

2. The substrate processing system of claim 1, further comprising a plurality of substrate supports disposed about the transfer region, each substrate support of the plurality of substrate supports vertically translatable along a central axis of the substrate support between a first position and a second position.

3. The substrate processing system of claim 1, wherein the first lid plate further defines a recessed ledge about each aperture of the plurality of apertures in a second surface of the first lid plate opposite the first surface of the first lid plate, and wherein each lid stack of the plurality of lid stacks seated on the first lid plate on a separate recessed ledge defined in the second surface of the first lid plate.

4. The substrate processing system of claim 1, wherein the transfer region comprises a transfer apparatus rotatable about a central axis and configured to engage substrates and transfer substrates among a plurality of substrate supports within the transfer region.

5. The substrate processing system of claim 1, wherein the second lid plate defines a plurality of apertures through the second lid plate, each aperture of the plurality of apertures accessing a lid stack of the plurality of lid stacks, the substrate processing system further comprising:
a plurality of output manifolds, each output manifold of the plurality of output manifolds disposed in a separate aperture of the plurality of apertures defined through the second lid plate.

6. The substrate processing system of claim 5, wherein the component of each lid stack of the plurality of lid stacks coupled with the second lid plate is characterized by a first surface facing the second lid plate, and characterized by a second surface opposite the first surface.

7. The substrate processing system of claim 6, further comprising:
a first o-ring positioned on the first surface of the component of each lid stack of the plurality of lid stacks coupled with the second lid plate, wherein each first o-ring engages a corresponding output manifold.

8. The substrate processing system of claim 7, wherein the component of each lid stack of the plurality of lid stacks is coupled with the second lid plate at a plurality of locations with a plurality of engagement apparatuses, and wherein each engagement apparatus comprises:
a bolt extending through the component of each lid stack and engaging the second lid plate,
a washer seated against the bolt, and
a spring engaging the washer at a first end of the spring and the component of each lid stack at a second end of the spring opposite the first.

9. The substrate processing system of claim 8, wherein each engagement apparatus further comprises a clip extending about the bolt, wherein the clip is sized to seat the washer along a first surface of the washer when the bolt is disengaged from the second lid plate.

10. The substrate processing system of claim 9, wherein a gap is maintained between the clip and the washer when the bolt engages the second lid plate.

11. The substrate processing system of claim 9, wherein the clip of each engagement apparatus is a first clip, and wherein each engagement apparatus further comprises a second clip extending about the bolt.

12. The substrate processing system of claim 11, wherein each second clip is sized to seat on the washer along a second surface of the washer when the bolt is disengaged from the second lid plate.

13. A substrate processing system comprising:
   a chamber body defining a transfer region;
   a first lid plate seated on the chamber body along a first surface of the first lid plate, wherein the first lid plate defines a plurality of apertures through the first lid plate;
   a plurality of lid stacks equal to a number of apertures of the plurality of apertures, wherein the plurality of lid stacks at least partially define a plurality of processing regions vertically offset from the transfer region, and wherein each lid stack of the plurality of lid stacks comprises a gasbox; and
   a second lid plate coupled with the plurality of lid stacks, wherein the plurality of lid stacks are positioned between the first lid plate and the second lid plate, and wherein the gasbox of each lid stack of the plurality of lid stacks is coupled with the second lid plate by a plurality of engagement apparatuses, each engagement apparatus comprising a spring compressibly engaging the gasbox with the second lid plate.

14. The substrate processing system of claim 13, wherein each engagement apparatus further comprises:
   a shoulder bolt extending through the gasbox and engaging the second lid plate, wherein a shank of the shoulder bolt seats against the second lid plate when the shoulder bolt is fully engaged with the second lid plate,
   a washer seated against the shoulder bolt at a head of the shoulder bolt about the shank, and
   a spring engaging the washer at a first end of the spring and engaging the gasbox at a second end of the spring opposite the first end of the spring.

15. The substrate processing system of claim 14, wherein each engagement apparatus further comprises a clip disposed within the gasbox about the shoulder bolt, wherein the clip is sized to seat the washer along a first surface of the washer when the shoulder bolt is disengaged from the second lid plate.

16. The substrate processing system of claim 15, wherein a gap is maintained between the clip and the washer when the shank of the shoulder bolt is seated against the second lid plate.

17. The substrate processing system of claim 13, further comprising a transfer apparatus positioned within the transfer region and rotatable about a central axis, wherein the transfer apparatus is configured to engage substrates and transfer substrates among a plurality of substrate supports within the transfer region.

18. The substrate processing system of claim 13, wherein the second lid plate defines a plurality of apertures through the second lid plate, each aperture of the plurality of apertures accessing a lid stack of the plurality of lid stacks, the substrate processing system further comprising:
   a plurality of output manifolds, each output manifold of the plurality of output manifolds disposed in a separate aperture of the plurality of apertures defined through the second lid plate.

19. The substrate processing system of claim 18, further comprising a remote plasma unit seated on the second lid plate and fluidly coupled with each output manifold of the plurality of output manifolds.

* * * * *